Figure 1F:
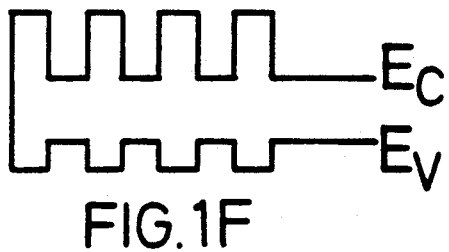

United States Patent [19]

Schubert et al.

[11] Patent Number: 5,216,260

[45] Date of Patent: Jun. 1, 1993

[54] OPTICALLY BISTABLE SEMICONDUCTOR DEVICE WITH PAIRS OF MONOATOMIC LAYERS SEPARATED BY INTRINSIC LAYERS

[75] Inventors: Erdmann Schubert; Klaus Ploog, both of Stuttgart; Albrecht Fischer, Löchgau, all of Fed. Rep. of Germany

[73] Assignee: Max-Planck Gesellschaft zur Foerderung der Wissenschaften e.V., Goettingen, Fed. Rep. of Germany

[21] Appl. No.: 722,589

[22] Filed: Jun. 27, 1991

Related U.S. Application Data

[60] Continuation of Ser. No. 636,017, Jan. 4, 1991, Pat. No. 5,060,234, which is a division of Ser. No. 413,911, Sep. 28, 1989, abandoned, which is a division of Ser. No. 798,053, Nov. 14, 1985, Pat. No. 4,882,609.

[51] Int. Cl.$^5$ .................. H01L 29/02; G02F 3/02
[52] U.S. Cl. .................. 257/9; 257/12; 257/20; 257/192; 257/280; 257/464; 257/592; 257/593; 257/604; 257/656; 359/243
[58] Field of Search ............ 357/4, 16, 58; 359/243, 359/244; 257/9, 12, 14, 656

[56] References Cited

U.S. PATENT DOCUMENTS

| | | | |
|---|---|---|---|
| 3,621,466 | 11/1971 | Misawa | 331/107 R |
| 3,882,533 | 5/1975 | Dohler | 357/58 |
| 4,083,062 | 4/1978 | Ohuchi et al. | 357/13 |
| 4,163,237 | 7/1979 | Dingle et al. | 357/16 |
| 4,205,329 | 5/1980 | Dingle et al. | 357/16 |
| 4,208,667 | 6/1980 | Chang et al. | 357/16 |
| 4,410,902 | 10/1983 | Malik | 357/13 |
| 4,591,889 | 5/1986 | Gossard et al. | 357/4 |
| 4,597,638 | 7/1986 | Chemla et al. | 359/244 |
| 4,716,449 | 12/1987 | Miller | 359/243 |
| 4,795,241 | 1/1989 | Komatsu et al. | 359/243 |
| 4,833,508 | 5/1989 | Ishikawa | 357/4 |
| 4,882,609 | 11/1989 | Schubert et al. | 357/22 |

FOREIGN PATENT DOCUMENTS

| | | |
|---|---|---|
| 0113074 | 7/1984 | European Pat. Off. . |
| 0115591 | 8/1984 | European Pat. Off. . |
| 0145403 | 6/1985 | European Pat. Off. . |
| 59-124769 | 7/1984 | Japan . |

OTHER PUBLICATIONS

C. E. C. Wood et al., *Complex Free-Carrier Profile Synthesis by "Atomic Plane" doping of MBE GaAs*, pp. 383-387, J. Appl. Phys. 51(1), Jan. 1980.

C. E. C. Wood et al., *Hyper-Thin Channel M.B.E. GaAs Power F.E.T.'s by Single Atomic Plane Doping*, p. 16-3, International Electronic Devices Meeting, 1979.

Arnold et al., *High Performance Inverted and Large Current Double Interface Modulation-Doped Field-Effect Transistors With the Bulk (Al, Ga) As Replaced by Superlattice at the Inverted Interface*, pp. 902-904, Appl. Phys. Lett., vol. 45, No. 8, Oct. 15, 1984.

K. Yamaguchi et al., *A New Short Channel MOSFET with an Atomic-Layer-Doped Impurity-Profile (AL-D-MOSFET)*, pp. 267-270, 2419 Japanese Journal of Applied Physics. Supplements vol. 22 (1983).

R. J. Malik et al., *Planar-Doped Barriers in GaAs by Molecular Beam Epitaxy*, pp. 836-838, Electronics Letters, Oct. 23, 1980, vol. 16, No. 2.

R. J. Malik et al., *GaAs Planar-Doped Barrier Transistors Grown by Molecular Beam Epitaxy*, pp. 87-96, Zie Voor Titel Boek, de 2e Pagina.

F. Capasso, *Band-Gap Engineering Via Graded Gap, Superlattice, and Periodic Doping Structures: Applications to Novel Photodetectors and Other Devices*, pp. 457-461, J. Vac. Sci. Technol. B1(2), Apr.-Jun. 1983.

D. A. B. Miller, *Novel Hybrid Optically Bistable Switch: The Quantum Well Self-Electro-Optic Effect Device*, pp. 13-15, Appl. Phys. Lett 45(1), Jul. 1984.

S. Tiwari et al., *Compensating Charge Layers in High Electron Mobility Transistors* IBM Technical Disclosure Bulletin, vol. 27, No. 9, Feb. 1985.

*Primary Examiner*—Gene M. Munson
*Attorney, Agent, or Firm*—Townsend and Townsend Khourie and Crew

[57] ABSTRACT

An optically bistable semiconductor device which has a doped or undoped gallium arsenide substrate and a series of alternating n-type and p-type Dirac-delta doped monoatomic layers formed on the substrate. Each Dirac-delta doped monoatomic layer is separated from the next adjacent Dirac-delta doped monoatomic layer by a layer of pure, undoped intrinsic semiconductor material such as gallium arsenide.

2 Claims, 7 Drawing Sheets

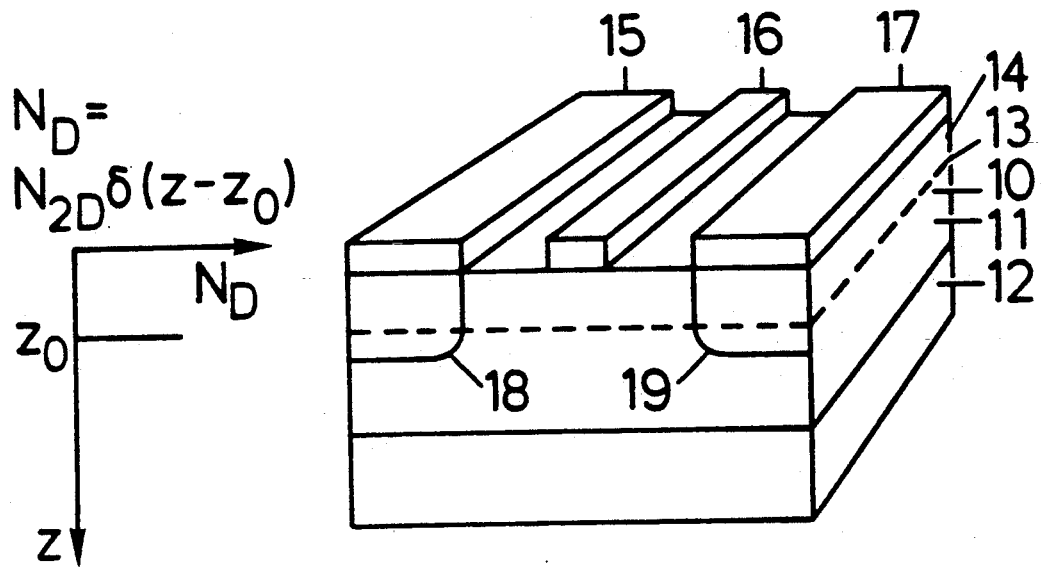
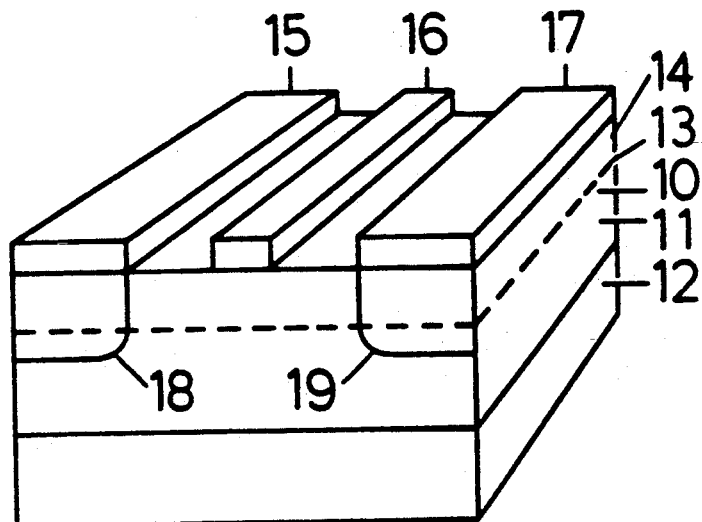
FIG.1A  FIG.1
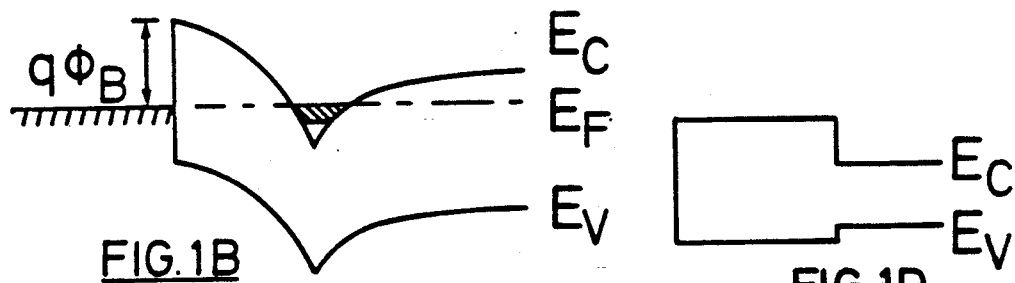
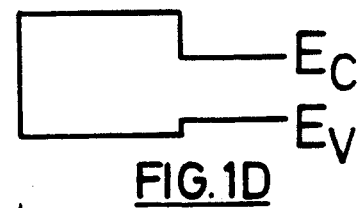
FIG.1B  FIG.1D
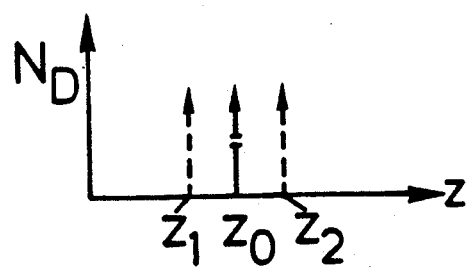
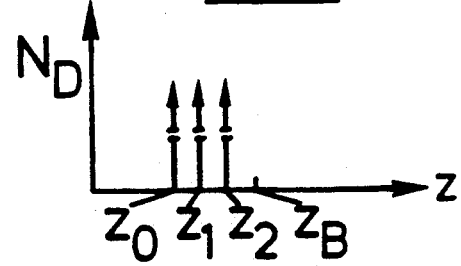
FIG.1C  FIG.1E

OPTICALLY BISTABLE SEMICONDUCTOR DEVICE WITH PAIRS OF MONOATOMIC LAYERS SEPARATED BY INTRINSIC LAYERS

This is a continuation of Ser. No. 07/636,017, filed Jan. 4, 1991, now U.S. Pat. No. 5,060,234, which was a division of Ser. No. 07/413,911, filed Sep. 28, 1989 now abandoned, which in turn was a division of U.S. patent application Ser. No. 06/798,053, filed Nov. 14, 1985, now U.S. Pat. No. 4,882,609.

The present invention relates to improved semiconductor devices consisting of epitaxial material and has particular reference to improved field effect transistors, impatt diodes, bipolar transistors and injection diodes and lasers.

Field effect transistors are electronic amplifier components which have an electronically conductive channel which is located close to the surface of the material. Electrons are injected via the source electrode into the channel and are extracted from the channel via the drain electrode. A gate electrode is located between source and drain and makes it possible to deplete the electron channel or to enhance it with electrons by the application of a suitable potential.

The conductive electron channel can be manufactured in different ways with III–V compound semiconductors.

Field effect transistors are known in which the electron channel is produced by epitaxial growth of a conductive doped epitaxial layer. Various epitaxial processes are used such as liquid phase epitaxy (LPE), gas phase epitaxy (CVD) and molecular beam epitaxy (MBE).

Field effect transistors are also known in which the conductive channel is produced with the aid of diffusion of impurity atoms.

In addition field effect transistors are known in which the electron channel is produced with the aid of ion implantation in highly resistive (GaAs) so that a buried channel is created.

Field effect transistors are also known which consist of two semiconductor materials with different band gaps, for example (GaAs) and (AlGaAs). The material with the energetically higher conduction band (AlGaAs) is homoneously doped with electrons, the electrons do not however remain with their donors but transfer instead into the material with the lower band gap (GaAs) because free states of lower energy are present in this material. The free electrons and spatially fixed donors are thus separated in space. The charge transfer is known as the modulation doping effect. These field effect transistors have the names HEMT, TEGFET or MODFET.

Furthermore, field effect transistors are known which function in accordance with the principal described immediately above but which make use of a semiconductor superlattice in place of the material with the larger band gap. The superlattice is for example made of GaAs/AlGaAs or of GaAs/AlAs. The lowest permitted electronic sub-bands should lie at energies substantially higher than the conduction band of the material with the low band gap (GaAs). In the material system AlGaAs/GaAs which is used as the alloy superlattice one only dopes the GaAs in order to suppress the undesired permanent photoconduction (PPC) which arises on doping AlGaAs.

All the above described electron channels are obtained by homogeneously doping the semiconductor material or parts thereof.

The doping profiles can be described mathematically by analytical, non-singular functions.

The principal object underlying the present invention is to provide a variety of semiconductor devices, in particular field effect transistors, with decisively improved characteristics without unduly complicating the manufacture thereof.

In order to satisfy this object there is provided a semiconductor device consisting of epitaxial material and characterised in that it includes at least one dirac-delta doped monoatomic layer of doping atoms, which can be donors or acceptors depending on the application.

In other words, the doping atoms are confined to a single layer which is just 1 atom thick. Typical surface concentration of the donors (acceptors) in this monoatomic layer are $10^{11}$ to $10^{14}$ cm$^{-2}$. From these figures it will be seen that only some of the atomic positions in the monoatomic layer are occupied by doping atoms. Nevertheless, the invention makes it possible, surprisingly, to locally exceed the limit of the solubility of the doping element in the host crystal and this leads to a higher concentration of free carriers in the semiconductor material which has beneficial effects on the performance of the semiconductor device (the maximum concentration of free electrons in the semiconductor material is normally determined by the maximum solubility of the doping element in the host crystal).

The monoatomic layer of doping atoms is preferably provided, in accordance with the invention, by the use of molecular beam epitaxy.

In the normal growth mode of a molecular beam epitaxy installation the host crystal grows by vaporisation of the elements of the crystals from effusion cells, with the elements combining at the surface of the substrate that is being grown to form the semiconductor compound in epitaxial form. In the impurity growth mode only the doping element is vaporised and it is this that creates the (fraction of a) monoatomic layer of donor (acceptors) atoms. The doping only takes place at one particular plane ($z=z_0$). At all other locations ($z \neq z_0$) the intended doping is zero. The unintentional doping by residual impurities should be kept as low as possible. From the above it can be seen that the doping profile is described by the Dirac-delta function:

$$N_D = N_{2D} \delta(z - z_0)$$

where $N_D$ equals the doping concentration in three dimension, $N_{2D}$ is the two-dimensional doping concentration, and $\delta(z-z_0)$ is the Dirac-delta function having the the value infinity at $z=z_0$ and the value 0 at all other vaues of z.

For the sake of simplicity the expression Dirac-delta-doping will henceforth be designated $D^3$.

Although the doping elements are spatially fixed within one atomic plane, the free carriers diffuse and their typical smearing length is the Debeye screening length $1_D$.

In a preferred embodiment of the invention the semiconductor device is a field effect transistor having source, drain and gate regions and the or each Dirac-delta doped monoatomic layer extends between said source and drain regions. In the simplest practical embodiment of this form of field effect transistor the epitaxial material is a homogeneous semiconductor material and only one Dirac-delta doped monoatomic layer is present, further monoatomic layers can however be added at spaced intervals, i.e. at different values of z, with layers of the homogenous semiconductor material interposed between successive $D^3$ monoatomic layers. This basic embodiment, which is relatively simple to manufacture, already possesses substantially improved characteristics when compared with known devices. In particular the transconductance is higher than for conventional field effect transistors because the transconductance is approximately proportional to the square root of the free electron concentration. Furthermore, the transconductance increases for small channel-gate distances. In addition, the gate breakdown voltage is higher than is the case with homogeneously doped field effect transistors. In a homogeneously doped MESFET the maximum gate voltage is limited by the breakdown electric field below the gate and the field increases linearly in homogeneously doped layers. In the present case the field is however constant between the gate and the two-dimensional electron gas associated with the $D^3$ monoatomic layer (s) and this accounts for the higher gate breakdown voltage.

A further field effect transistor in accordance with the present invention is characterised in that the material has a heterostructure consisting of first and second layers of distinct semiconductor materials having different band gaps; in that said source and drain regions extend through one of said layers at least part-way into the other; and in that the or each Dirac-delta doped monoatomic layer is disposed in said material having the greater band gap. With this arrangement the electrons do not remain with the donors but transfer instead into the material with lower band gap which results in the device being able to operate with high current densities.

A further development of the field effect transistor of the present invention is characterised in that said material has a superlattice structure consisting of alternating layers of first and second distinct semiconductor materials having different band gaps, in that said source and drain regions extend through several of said layers; and in that at least one Dirac-delta doped monoatomic layer is present in each of the alternating layers of the semiconductor material having the smaller band gap.

As a result of this structure potential wells are created. Furthermore, as a result of quantum effects (size quantization), the lowest permitted sub-band energy should be substantially higher than the conduction band edge of the semiconductor with the lower band gap. In practice the potential wells of the superlattice are made so narrow that the energy of the lowest sub-band lies above the Fermi level. The free electrons then form a two-dimensional electron gas in the semiconductor with the lower band gap as a result of charge carrier transfer. The monoatomic layer doping of the potential wells makes it possible to achieve a higher electron concentration than would be possible with homogenous doping. Accordingly field effect transistors constructed in this way also have a greater transconductance.

The present invention also contemplates an improved form of impatt diode which comprises in sequence a first layer of highly doped n-type substrate, a second layer of highly doped n-type material, a third layer of intrinsic material, a fourth layer of n-type material and a fifth layer of highly doped p-type material, with the contacts being respectively connected to said fifth layer and to at least one of said first and second layers; a first Dirac-delta doped monoatomic layer of donors present between said second and third layers; and a second Dirac-delta doped monoatomic layer of acceptors present between said fourth and fifth layers.

An impatt diode of this kind exhibits extremely abrupt transitions and a high cut-off frequency.

The present invention is also directed to an improved semiconductor device in the form of a bipolar transistor wherein the bipolar transistor comprises in sequence a first layer of highly doped n-type substrate, a second layer of n-type material, a Dirac-delta doped monoatomic layer of acceptors, a third layer of highly doped n-type material, and a fourth layer of very highly doped n-type material with the collector contact being formed on at least one of said first and second layers, with the base contact being formed on said Dirac-delta doped monoatomic layer and with the emitter contact being formed on said third layer.

A bipolar transistor of this kind has an extremely small base width and a high cut-off frequency.

One particularly favoured embodiment of the invention relates to an injection diode, which can also be modified to form an injection laser. Thus, according to the present teaching, an injecton diode comprises in sequence a first layer of a highly doped n-type semiconducting substrate, a second layer of a highly doped n-type semiconducting material, a third layer of a distinct semiconducting material in intrinsic form and a fourth layer of a highly doped p-type version of the material of said second layer, wherein the first and second electrical connections are respectively made to said fourth layer and to at least one of said first and second layers, and wherein one or more pairs of Dirac-delta doped monoatomic layers are provided in said third intrinsic layer, the first Dirac-delta doped monoatomic layer of each pair comprising a monoatomic layer of donors and the second Dirac-delta doped monoatomic layer of each pair comprising a monoatomic layer of acceptors positioned parallel to and spaced apart from the first Dirac-delta doped layer of the pair on the side thereof facing said fourth layer.

In order to convert this injection diode into an injection laser it is only necessary to make one side face of said device disposed parallel to the direction of said sequence of layers specularly reflective and to make a second side face extending parallel to the first side face partially reflective.

The Dirac-delta-doping of this diode or laser structure forms V-shaped potential wells in which electrons and holes collect. The permitted energy states of the electrons and holes are sub-band levels in the V-shaped potential wells. Radiative electron hole transitions take place between the sub-bands of the V-shaped potential wells. A device of this kind has high efficiency (quantum efficiency) as a result of the immediate proximity of the n- and p-Dirac-delta doped layers. The arrangement also makes possible the emission of light quanta with an energy which is smaller than the band gap of the host crystal.

Furthermore, pronounced carrier confinement or localisation occurs in the V-shaped potential wells which leads to low threshold currents for the laser.

The new current injection laser thus consists of a series of n and p-type Dirac-delta function-like doping peaks. The conduction band edge and the valence band edge of the semiconductor are shaped like a sawtooth Therefore, the structure is called a saw-tooth superlattice (STS).

The band gap energy of the STS-light emitting diode (LED) or of the STS-laser is smaller as compared to the intrinsic host material, typically pure, undoped GaAs. The STS is characterised by a large overlap of electron and hole wave functions due to a quantum mechanical coupling of electrons in adjacent V-shaped quantum wells. Typical doping concentration of the STS device is $$1 \times 10^{12} \text{ cm}^{-2} \leq N_{D,A}{}^{2D} \leq 1 \times 10^{14} \text{ cm}^{31\,2}$$

typical period length of the STS device $$50 \text{ Å} \leq Z_p \leq 500 \text{ Å}$$

The operation of light emitting diode devices (LED's) made from a GaAs sawtooth superlattice has been demonstrated (with doping concentrations and period lengths as specified immediately above) and light emission has been obtained in the wavelength range $$900 \text{ nm} \leq \lambda \leq 970 \text{ nm},$$

i.e. at significantly longer wavelengths as compared to the wavelengths obtained with undoped GaAs ($\lambda = 870$ nm at room temperature).

In corresponding laser devices laser emission has been demonstrated in the wavelength range $$900 \text{ nm} \leq \lambda \leq 910 \text{ nm}.$$

The sawtooth superlattice can be used in a light wave detecting device, for example a photoconductor.

Thus, in accordance with a further embodiment of the present invention, there is provided a semiconductor device in the form of a semiconductor light wave detector, said device being characterised by a first layer of a highly doped n-type semiconducting substrate; by a second layer of a highly doped n-type semiconducting material, by a third layer of a distinct intrinsic semiconducting material and by a fourth layer of a highly doped n-type semiconducting material similar to said second layer, with first and second connections being provided to said fourth layer and to at least one of said first and second layers; the semiconductor device being further characterised by a plurality of pairs of Dirac-delta doped monoatomic layers provided in said third intrinsic layer, with the first Dirac-delta doped monoatomic layer of each pair comprising a monoatomic layer of donors and with the second Dirac-delta doped monoatomic layer of each pair comprising a monoatomic layer of acceptors positioned parallel to and spaced apart from the associated first Dirac-delta doped layer on the side thereof facing said fourth layer.

As a result of this arrangement electrons and holes are transported in perpendicular direction to the layers of the STS. The new photoconductor has a large gain-bandwidth product. Electrons are transported easily perpendicular to the layers due to their small effective mass $m_e$ and their comparatively high subband energy $E_o{}^e$. Holes are less easily transported than electrons in the perpendicular direction due to their comparatively large effective mass $m_{hh}$ and their small subband energy $E_o{}^{hh}$. Electrons therefore have a small transit time $t_t$ through the STS as compared to holes. The recombination lifetime $\tau$ of the STS can be chosen in a wide range by choosing an appropriate period length of the STS. Therefore, the ratio $t_t/\tau$ which determines the gain-bandwidth product of the detector can be selected in a wide range. High speed and high gain photodetectors can be made with the STS.

The STS can be applied in optically bistable devices.

In this respect, according to an aspect of the present invention, there is provided an optically bistable semiconductor device which is characterised in that it comprises, in sequence, a first layer of an n-type semiconducting substrate which may be doped or undoped, a series of alternating n-type and p-type Dirac-delta doped monoatomic layers formed on said substrate with each Dirac-delta doped monoatomic layer being separated from the next adjacent Dirac-delta doped monoatomic layer by a layer of pure, undoped intrinsic semiconductor.

A device of this kind requires no electrical contacts and is particularly useful as an optical switch. By way of example the device can be made so that it absorbs an incident light beam of low intensity and does not transmit this light beam. On the other hand, if the incident light beam is of high intensity above a certain threshold the device will transmit a beam of light. The optical bistability of the STS is due to a band filling of electron and hole subbands. A reduction of the optical absorption at energies close to the STS energy gap results. The recombination lifetime, which determines the optical threshold intensity at which band filling occurs can be selected by choosing an appropriate superlattice period length $z_p$. If this period length is short then the recombination lifetime is short whereas if it is long the recombination lifetime is also long due to the resulting spatial separation of electrons and holes.

For semiconductor devices using only one basic type of semiconductor material the preferred material is gallium arsenide. For semiconductor devices in accordance with the present teaching which require two distinct semiconductor materials (for example heterostructures and superlattice structures) the two distinct semiconductor materials preferably comprise gallium arsenide GaAs and aluminium gallium arsenide $Al_x Ga_{l-x}As$ with suitable dopants, such as silicon to produce n-type conductivity and phosphorus to produce p-type conductivity.

The present teaching is generally applicable to silicon and germanium semiconductors and to compound semiconductors, in particular to III–V, II–VI and III–VI compound semiconductors.

In all embodiments the doping concentration in the or each Dirac-delta doped monoatomic layer expediently lies in the range up to $10^{14}$ cm$^{-2}$ and preferably in the range $10^{11}$ to cm$^{-2}$.

Finally, it should be pointed out that the structures of field effect transistors, impatt diodes, bipolar transistors and injection diodes and lasers claimed herein can also potentially be realised by substituting n-type materials for p-type materials and vice versa and that the claims hereof also extend to the parallel devices with such inverted structures, in which case references to donors should be read as references to acceptors, and references to electrons should be read as references to holes and vice versa.

Figure 1H:
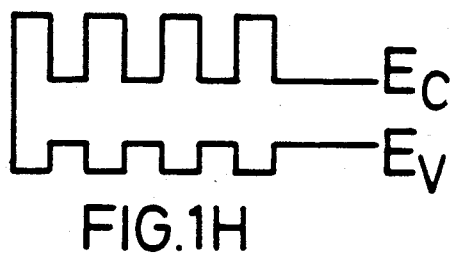
Figure 1G:
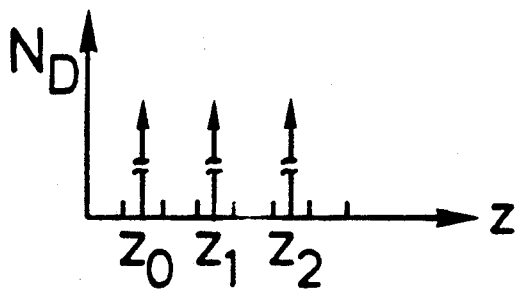
Figure 1I:
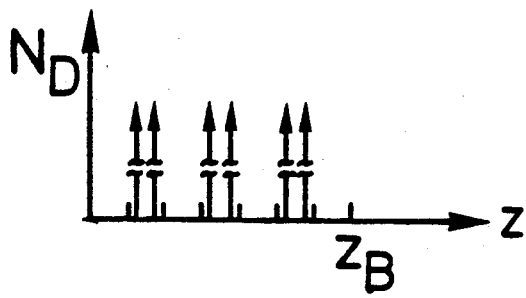
Figure 1J:
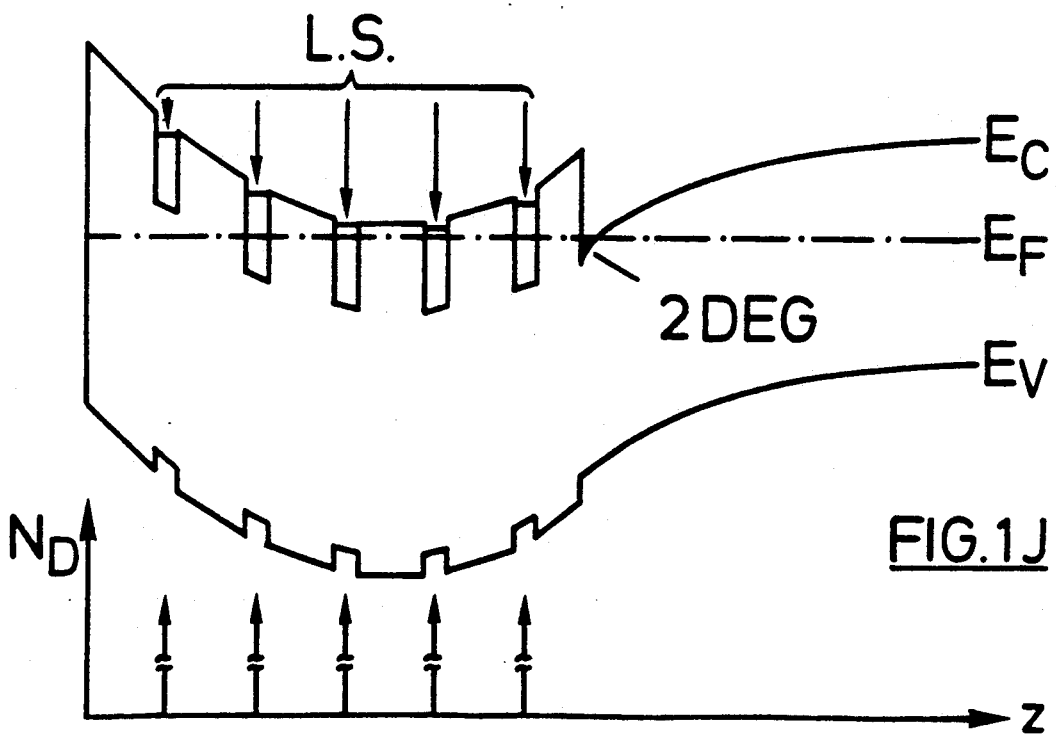
Figure 2:
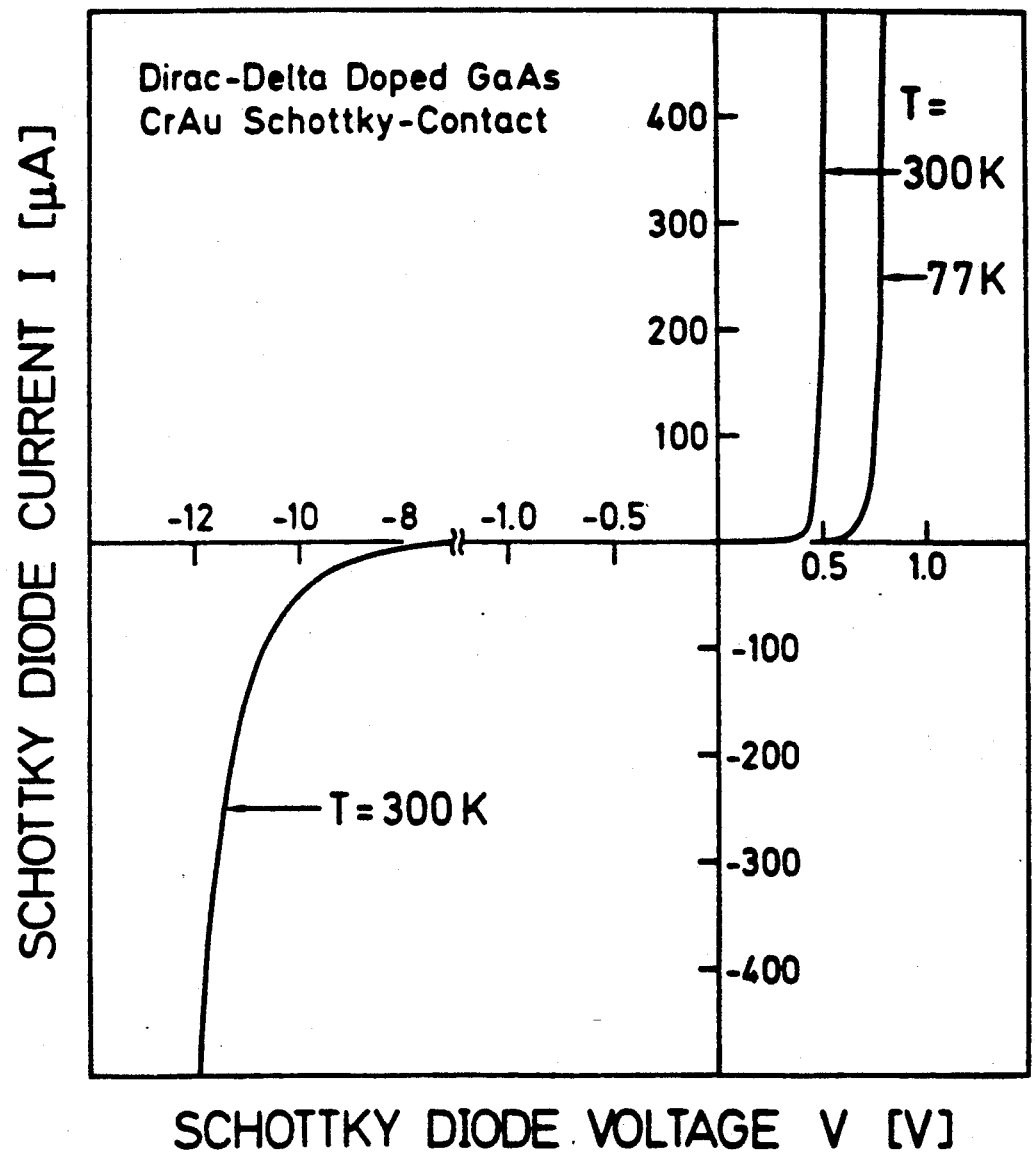
Figure 3:
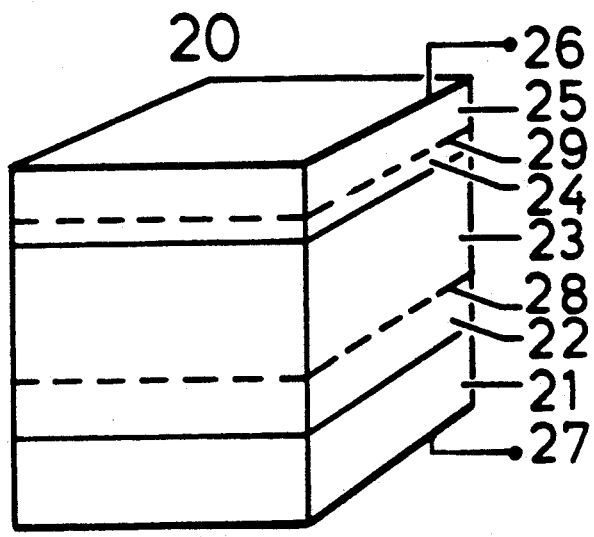
Figure 4:
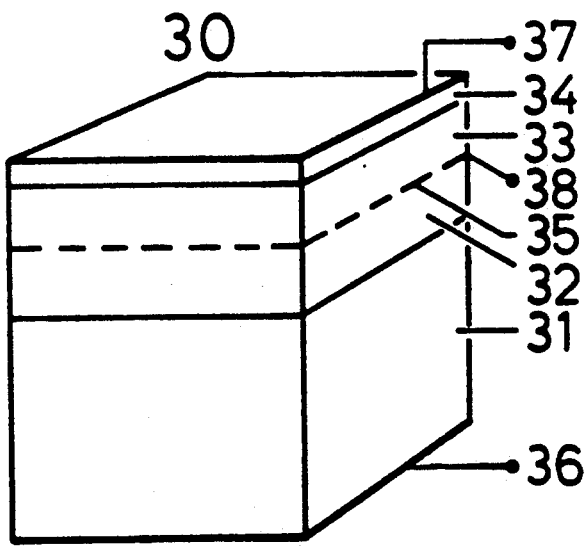
Figure 5:
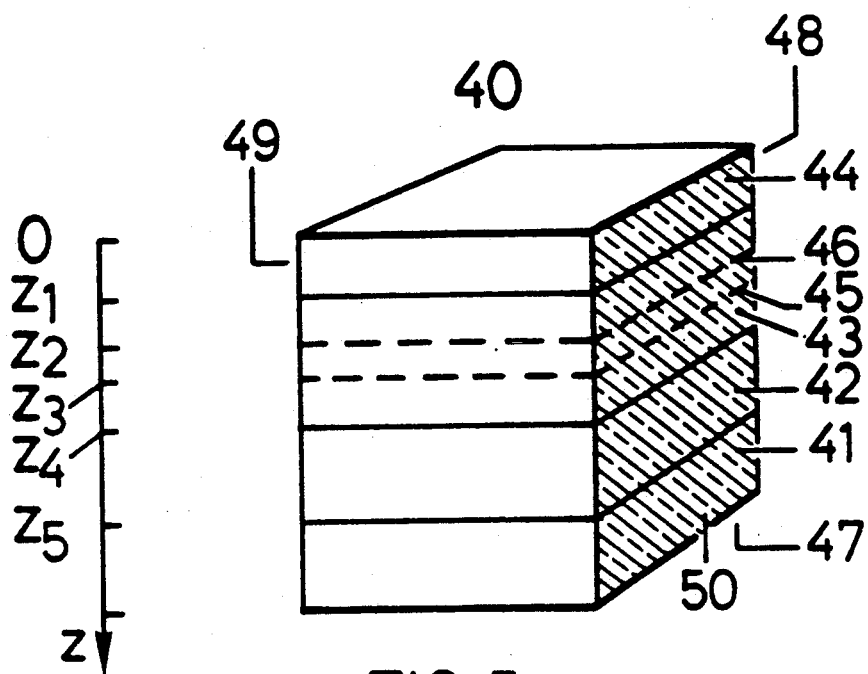
Figure 5A:
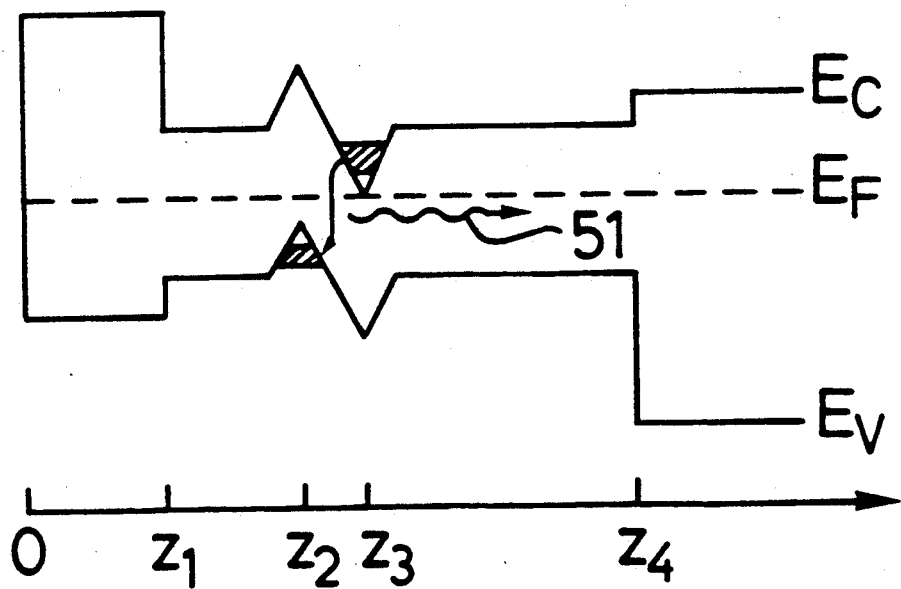
Figure 6:
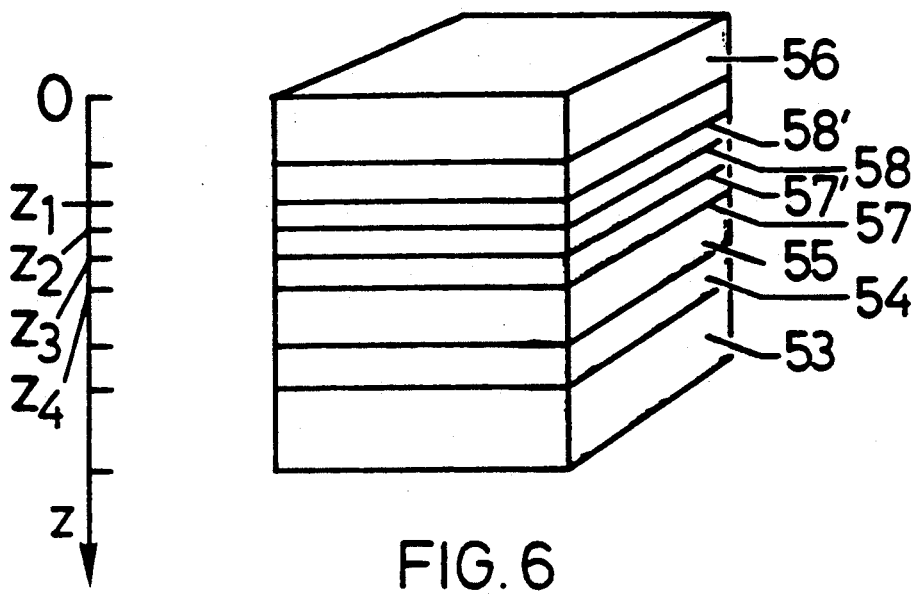
Figure 6A:
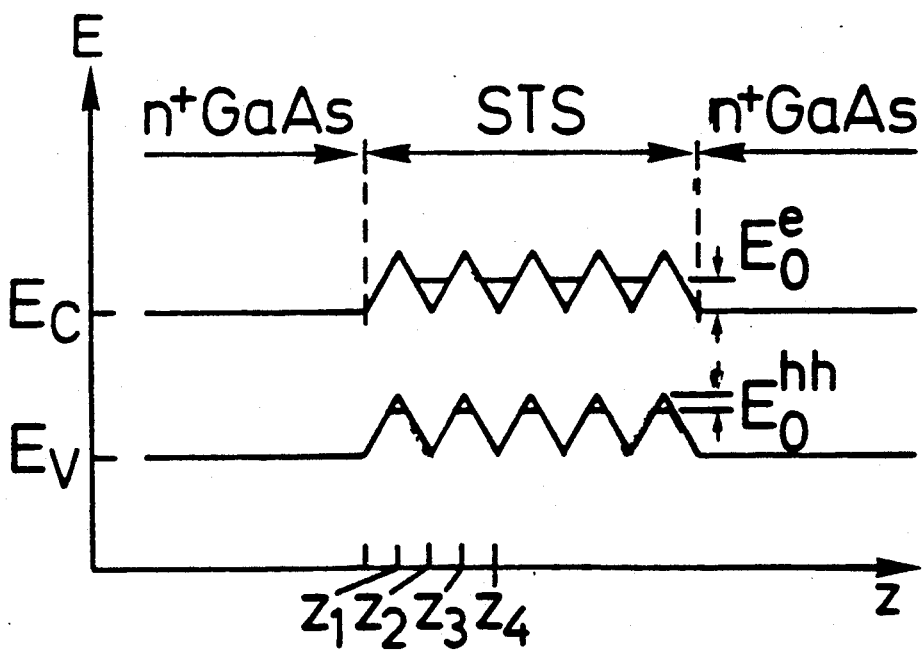
Figure 7:
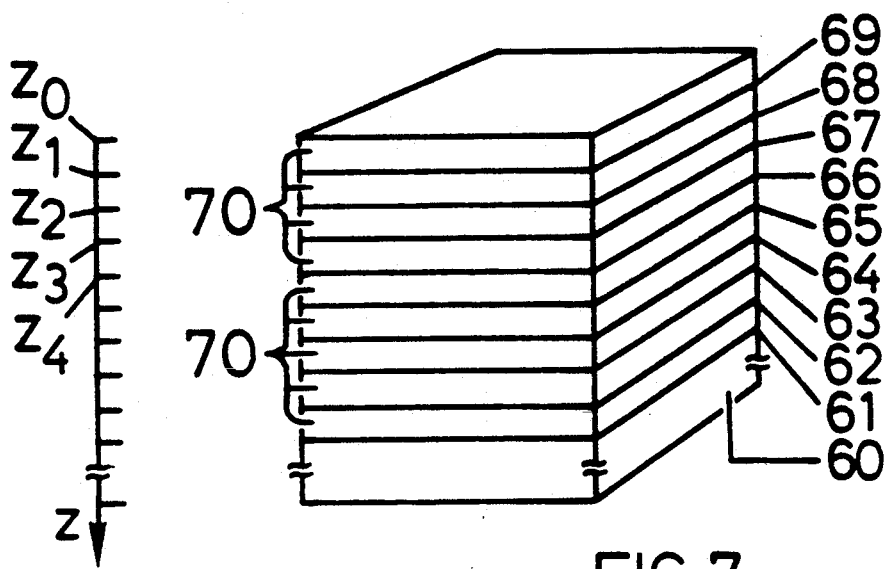
Figure 7A:
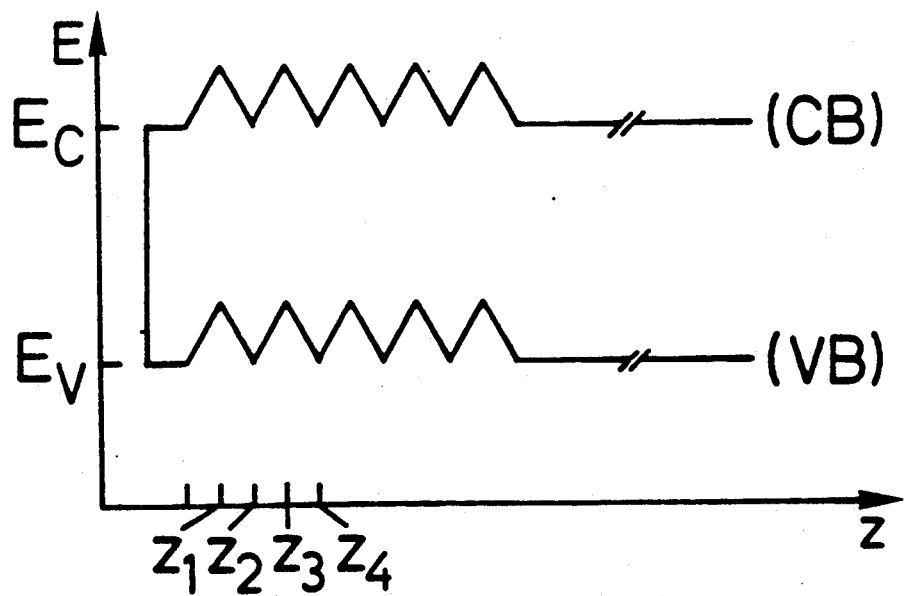

The invention will now be described in more detail by way of example only and with reference to a variety of distinct embodiments as illustrated in the accompanying drawings which show;

FIG. 1 is a schematic perspective view of a field effect transistor in accordance with the present invention, FIG. 1a a doping profile showing the position of the Dirac-delta doped layer in the field effect transistor of FIG. 1, FIG. 1b schematic band scheme illustrating the conductance and valence bands of a homogenous epitaxial semiconductor material used for the field effect transistor of FIG. 1 in the vicinity of the $D^3$ layer, FIG. 1c an alternative doping profile to that shown in FIG. 1a showing the presence of three dirac-delta doped monoatomic layers in a homogenous epitaxial semiconductor material, FIG. 1d a band scheme for a modified version of the field effect transistor of FIG. 1 consisting of two distinct epitaxial semiconductor materials which meet at a boundary $z_B$, FIG. 1e the doping profile for a field effect transistor with a hetero structure in accordance with FIG. 1d showing the position of the multiple Dirac-delta doped monoatomic layers relative to the boundary $z_B$, FIG. 1f a band scheme for a further modified version of the field effect transistor of FIG. 1 having a superlattice structure consisting of alternate layers of different epitaxially grown semiconductor materials, FIG. 1g a doping profile illustrating the position of the Dirac-delta doped monoatomic layers relative to the band scheme of FIG. 1f, FIG. 1h the same band scheme as in FIG. 1f, FIG. 1i an alternative doping profile to that shown in FIG. 1g in which two Dirac-delta doped monoatomic layers are provided in respect of each alternate layer of the hetero structure leading to the band scheme of FIG. 1h, FIG. 1j a modified band scheme similar to that of FIG. 1f in which alternate layers of the superlattice structure are made relatively narrow, with the structure exhibiting a doping profile for the Dirac-delta doped monoatomic layers in accordance with FIG. 1g, FIG. 2 the gate characteristic for the Schottky gate of the field effect transistor of FIG. 1, FIG. 3 a schematic perspective view of an impatt diode in accordance with the present invention, FIG. 4 a schematic perspective view of a bipolar transistor in accordance with the present invention, FIG. 5 a schematic perspective view of an injection laser in accordance with the present invention, FIG. 5a the band scheme for the injection laser of FIG. 5, FIG. 6 a schematic perspective view of a photoconductor in accordance with the present invention, FIG. 6a the band scheme for the photoconductor of FIG. 6, FIG. 7 a schematic perspective view of an optically bistable device in accordance with the present invention, and FIG. 7a the band scheme for the optically bistable device of FIG. 7.

Turning first to FIG. 1 there can be seen a field effect transistor 10 which in this case consists of an undoped epitaxial layer of gallium arsenide 11 which is grown on a semi-insulating substrate of gallium arsenide 12 by molecular beam epitaxy. Once the layer 11 has been grown to a thickness of approximately 1 m the usual crystal growth mode of the molecular beam epitaxy apparatus (hereinafter MBE apparatus) is interrupted by closing the gallium shutter of the gallium effusion cell and leaving the arsenic shutter of the arsenic effusion cell open. This results in an As stabilised crystal surface The shutter of the silicon cell which is used with gallium arsenide materials is however kept open so that an impurity growth mode results. This impurity growth mode is used to grow a layer 13 which is just 1 atom thick. This layer is conveniently referred to as a monoatomic layer. In fact the surface of the compound semiconductor gallium arsenide contains $1.25 \times 10^{15}$ atoms/cm$^2$, that is $6.25 \times 10^{14}$ gallium atoms/cm$^2$. The two dimensional (2D) silicon concentration $N_{2D}$ used for the layer 13 is smaller than $10^{13}$/cm$^2$ so that only a small fraction of the gallium sites of one monolayer are occupied by silicon atoms.

The MBE machine used for the growth of the layers is equipped with a 2 inch (5 cm) as azimuthally rotatable substrate holder and the growth region is completely surrounded by a liquid $N_2$ cryoshroud. The residual impurity concentration of undoped layers is p-type and in the $10^{14}$ cm$^{-3}$ range. After growth of the monoatomic layer 13 the normal growth mode is re-adopted and a layer 14 of undoped gallium arsenide of 13 nm (300Å) thickness is grown on top of the monoatomic layer 13. Because the monoatomic layer 13 is very thin the crystalline structure of the top layer 14 of gallium arsenide continues the crystalline structure of the layer 11.

The wafer grown in this way is then provided in the usual way with source 15, gate 16 and drain regions 17 to complete the structure of the field effect transistor. The source and drain regions are an alloy of gold and germanium and the gate region is formed of pure aluminium and constructed as a Schottky gate. During the diffusion process the source and drain regions form highly conductive zones 18, 19 within the wafer and the monoatomic layer 13 extends into these two zones 18 and 19.

The monoatomic layer 13 represents an abrupt step change in the doping profile which is illustrated in the graph of FIG. 1A which shows the monoatomic layer at a distance $z_0$ in the z-direction below the surface of the field effect transistor. Because of the sharpness of the change in the doping profile it can be conveniently represented by the mathematical Dirac-delta function and is referred to throughout as a Dirac-delta doped layer.

It has been shown by transmission electron microscopy that the layer 13 is indeed just one atom thick.

The proximity of the $D^3$ layer to the surface is favourable for FET operation. The distance of the Dirac-delta doped layer from the semiconductor surface (Schottky contact) is at most 1000 Å. The energy band diagram of a Dirac-delta doped epitaxial layer with a metal contact on top is shown in FIG. 1B and the associated doping profile for the $D^3$ layer at $z_0$ is illustrated immediately below it in FIG. 1C. As a result of electrostatic attraction the electrons stay close to their parent ionised donor impurities and form a two-dimensional electron gas in the V-shaped potentional well. Size quantization takes place in the narrow potential well. The electron de Broglie wavelength is matched to the width of the potential well and the sub-band energies can be calculated from the following expression:

$$E_i = (1/4) \, 2^{-1/3} \, (i + 1)^{2/3} \left[ \frac{q^2 h n_{2DEG}}{(m)^{1/2}} \right]^{2/3} \quad i = 0,1,\ldots \quad (1)$$

where q equals the elementary charge h equals Plancks constant $n_{2DEG}$ equals the two dimensional electron hole gas concentration $\epsilon$ equals the permittivity of the semiconductor material m* equals the effective electron or hole mass.

This formula is valid only for a symmetrically V-shaped potential well. In reality the potential well is not truly symmetrical, as illustrated in FIG. 1b, due to the proximity of the surface FIG. 1b also shows the position of the Fermi level and the barrier height q B at the metal semiconductor interface.

As previously mentioned the gate region is constructed as a Schottky gate. This is done because a stable dielectric is not known which is able to insulate the gate metal from the semiconductor at room temperature. Because of the $D^3$ layer the field between the gate and the two-dimensional electron gas formed at the layer 13 is constant. This results in the breakdown voltage of the reversely biased Schottky diode being substantially larger than in a comparable MESFET. A typical plot for the Schottky diode formed in the gate region is shown in FIG. 2. It will be noted that a large breakdown voltage $V_B = -11$ Volts is observed and is sufficient for FET operation. The diode characteristic in the forward direction is shown for the two temperatures 300° and 77° K. with threshold voltages of 0.5 and 0.7 Volts respectively. These voltages indicate that an enhancement type operation of the $D^3$ FET with a forward biased Schottky biased Schottky diode is possible. The ideality factor (n-value) measured from the diode characteristic of FIG. 2 in the forward direction is found to have the excellent value of n=1.05. In addition the built-in voltage of the diode is determined to be $V_{bi}=0.73$ Volts. Application of a reverse voltage depletes the $2_{DEG}$ associated with the $D^3$ layer due to the field effect.

Measurements on sample FETs contructed in the above manner have shown that the maximum three-dimensional carrier concentration is observed at zero bias about 300Å below the gallium arsenide surface and is $7.5 \times 10^{18}$ cm$^{-3}$. Such high electron concentrations are unknown in homogeneously doped material where the maximum doping concentration measured is $6 \times 10^{18}$ cm$^{-3}$. The extremely high electron concentrations are favourable for field effect transistor operation because the transconductance $g_m$ is proportional to the doping concentration n or square root of n according to the Schottky model and the saturated velocity model respectively.

FIG. 1C also shows two further $D^3$ layers placed at the levels $z_1$ and $z_2$. The effects of these layers are not however shown in the band scheme of FIG. 1B. The use of multiple layers does however lead to increased current density and is thus of interest in the practical construction of FETs. If such multiple layers are used they should extend between the source and drain zones 18 and 19 respectively.

In a modified version of the FET of FIG. 1 the semiconductor material is provided with a heterostructure rather than a homogenous structure. The band scheme for such a heterostructure is shown in FIG. 1D (prior to modification by the $D^3$ layer (S) and ignoring the presence of metal contacts. The heterostructure typically consists of a first layer 11 of $Al_xGa_{1-x}As$ onto which there is then grown a further epitaxial layer of GaAs. The boundary between the two layers of the heterostructure occurs at $z_B$ as illustrated on the corresponding plot of the doping profile shown in FIG. 1e. In this embodiment three $D^3$ layers are provided, each of which is identical with the layer 13 described in connection with FIG. 1. The three layers are provided in the material with the highest band gap, i.e. in the $Al_xGa_{1-x}As$. As a result of this doping arrangement the donors remain in the material with the highest band gap and the electrons move into free states in the material with the lower band gap. This arrangement results in the field effect transistor being able to operate at high current densities. It is of course necessary for the source and drain zones 18 and 19 of FIG. 1 to extend into the material with the biggest band gap and to contact the $D^3$ layers which are located at the distances of $z_0$, $z_1$ and $z_2$ respectively.

It is also possible to construct field effect transistors in accordance with the present invention using superlattice structures, i.e. alternating layers of two distinct epitaxially grown semiconductor materials. The band scheme for such a superlattice structure (again before doping and ignoring any metal contacts) is shown in FIG. 1F (and is repeated for the sake of convenience in FIG. 1H). With a superlattice structure of this kind the $D^3$ layers, which are each substantially identical to the layer 14 of the FET of FIG. 1 are provided in the material with the lower band gap as can be seen from the corresponding doping profile of FIG. 1G which shows three $D^3$ layers at $z_0$, $z_1$ and $z_2$. The short lines intersecting the z-axis in FIG. 1G represent the boundaries between the alternate layers of the superlattice structure.

Whereas FIG. 1G shows an arrangement with just one $D^3$ layer per alternate layer of the superlattice structure FIG. 1 shows a similar arrangement with pairs of $D^3$ layers in each alternate layer of the superlattice structure.

Finally, FIG. 1J shows a typical band scheme for a FET with a superlattice structure and Dirac-delta doping in accordance with FIG. 1G. In the particular arrangement on which FIG. 1J is based the potential wells of the superlattice are made so narrow, in accordance with the invention, that the energy of the lowest subband LS lies above the Fermi level. The free electrons then form a two-dimensional electron gas in the semiconductor with the lowest band gap as a result of charge transfer. The layer doping of the potential wells makes it possible to achieve a higher electron concentration than would be possible with homogeneous doping. Accordingly high values of transconductance are achieved in such field effect transistors.

Turning now to FIG. 3 there can be seen an impatt diode in accordance with the invention. The diode comprises in sequence a first layer of strongly doped n-type substrate 21, in this case gallium arsenide with an impurity concentration in the range $10^{17}$ to $10^{18}$ cm$^{-3}$. A second layer of highly doped n-type epitaxial material 22, again gallium arsenide with an impurity concentration in the range $10^{17}$ to $10^{18}$ cm$^{-3}$ is grown onto the substrate 21. The second layer of highly doped n-type material is followed by a third layer of intrinsic material 23, i.e. pure gallium arsenide, and this in turn followed by a fourth layer of n-type material 24 (gallium arsenide with impurity concentrations in the range $10^{16}$ to $10^{17}$) and by a fifth layer 25 of highly doped p-type gallium arsenide with impurity concentrations $10^{17}$ to $10^{18}$. Electrical contacts 26 and 27 are made to the fifth layer and to the first layer respectively. The special features of the impatt diode illustrated in FIG. 3 are the first Dirac-delta doped monoatomic layer 28 of donors which is present between said second and third layers, and the second Dirac-delta doped monoatomic layer of acceptors 29 present between the fourth and fifth layers 24 and 25 respectively. The doping concentrations in the two $D^3$ layers 28 and 29 lie in the range from $10^{11}$ to $10^{14}$ cm$^{-2}$ and are preferably selected to be $10^{13}$ cm$^{-2}$. The two layers are grown in the manner described with reference to the field effect transistor of FIG. 1, preferably using silicon for the donors of the layer 28 and berillium for the acceptors of the layer 29.

Turning now to FIG. 4 there can be seen a bipolar transistor which has been constructed in accordance with the present invention. The bipolar transistor 30 comprises in sequence a first layer of highly doped n-type substrate 31 (typically GaAs with impurity concentrations in the range $10^{17}$ to $10^{18}$ cm$^{-3}$), a second layer 32 of n-type material (gallium arsenide with an impurity concentration in the range $10^{16}$ to $10^{17}$ cm$^{-3}$), a third layer of highly doped n-type material 33 (gallium arsenide with an impurity concentration in the range $10^{17}$ to $10^{18}$) and a fourth layer of very highly doped n-type material 34 (gallium arsenide with an impurity concentration in the range above $10^{18}$ cm$^{-3}$). A $D^3$ monoatomic layer of acceptors having a concentration in the range between $10^{11}$ and cm$^{-2}$ is formed directly between the second and third layers 32, 33. The collector contact 36 is formed at the base of the first layer 31. The emitter contact 37 is formed on top of the fourth layer 34. The base contact 38 is made to the $D^3$ monoatomic layer 35.

The transistor 30 has an extremely low base width and a very high cut-off frequency.

FIG. 5 illustrates an injection laser 40 which is also constructed in accordance with the present invention. The laser diode of FIG. 5 has a first layer of a highly doped semiconducting substrate 41, in this case gallium arsenide with a donor concentration in the range $10^{17}$ to $10^{18}$/cm$^{-3}$. This first layer 41 is followed by a second layer of a distinct semiconducting material which is also epitaxially grown. In this case the second layer 42 consists of highly doped n-type Al$_x$Ga$_{l-x}$As with a donor concentration in the range $10^{17}$ to $10^{18}$ cm$^{-3}$. This second layer 42 is followed by a layer of intrinsic semiconducting material of the same type as the substrate, in this case gallium arsenide. The layer 43 is then followed by a fourth layer of a highly doped p-type version of the material of the second layer, i.e. Al$_x$Ga$_{l-x}$As with an impurity concentration in the range $10^{17}$ to $10^{18}$/cm$^{-3}$. A pair of $D^3$ monoatomic layers 45 and 46 are provided parallel to one another and spaced apart in said third layer 43. The layer 45 is a layer of donors whereas the layer 46 is a layer of acceptors. The doping concentrations in these two layers again lie in the range $10^{11}$ to $10^{14}$ cm$^{-2}$. The spacing between the two layers lies in the range 25A to 500A.

It is also possible to provide a plurality of pairs of $D^3$ monoatomic layers in the third intrinsic layer 43.

As can be seen from the associated band scheme shown in FIG. 5a the Dirac-delta doping arrangement in the injection laser of FIG. 5 forms two V-shaped potential wells in which the electrons and holes collect. The allowed energy states of the electrons and holes are sub-band levels in the V-shaped potential wells. Radiative electron hole transitions occur between the subbands of the V-shaped potential wells and generate photons which are radiated out of the device. The generation of these photons is promoted by the voltage applied across the structure via the two contacts 47 and 48 respectively. In the described form the device is in fact an injection diode. In order to convert it into an injection laser it is necessary to provide one side face with a specularly reflective coating 49 and to provide an opposite parallel side face 50 with a partially reflective coating illustrated by oblique strokes.

An injection laser or diode of this kind has a high degree of efficiency (quantum efficiency) due to the immediate proximity of the n- and p $D^3$ layers. Also the operating wavelength can be chosen to be below the wavelength associated with the band gap of the host crystal. Furthermore, pronounced carrier confinement occurs in the V-shaped potential wells which leads to low threshold currents for the device. The pairs of $D^3$ layers lie in the active zone of the laser.

Turning now to FIG. 6a there can be seen a schematic diagram of a semiconductor photodetector device. The device comprises, in sequence, a first layer of a highly doped n-type semiconducting substrate 53, a second layer of a highly doped n-type semiconducting material 54, a third layer of a distinct intrinsic semiconducting material 55 and a fourth layer of a highly doped n-type semiconducting material 56 similar to said second layer. First and second electrical connections (not shown) are provided to said fourth layer and to said first layer respectively. A plurality of pairs of Dirac-delta doped monoatomic layers 57, 57', 58, 58' are provided in said third intrinsic layer 55, with the first Dirac-delta doped monoatomic layer 57, 58 of each pair 57, 57', 58, 58' comprising a monoatomic layer of donors and with the second Dirac-delta doped monoatomic layer 57', 58' of each pair comprising a monoatomic layer of acceptors positioned parallel to and spaced apart from the associated first Dirac-delta doped layer on the side thereof facing said fourth layer. The pairs of Dirac-delta doped layers within the intrinsic layer 55 form the STS.

The band scheme for this device can be seen from FIG. 6a. It will be noted that so far as the subband energies are concerned the subband energy for electrons $E_o^e$ is greater than the subband energy for holes $E_o^{hh}$, as mentioned earlier in the introduction to the specification.

In the example shown the first, second and fourth layers are all of gallium arsenide and have respective impurity concentrations of $10^{17}$–$10^{19}$, $10^{17}$–$10^{19}$ and $10^{17}$–$10^{19}$ cm$^{-3}$, respectively. The layer 55 consists of GaAs. The acceptor and donor concentrations in the $D^3$ layers again lie in the range $10^{11}$ to $10^{14}$ cm$^{-2}$. The spacing between sequential $D^3$ layers is typically 25°–250° Å and the layers 54, 55 and 56 have respective thicknesses of 0.1–0.5$\mu$, 0.1–1.0$\mu$ and 0.1–0.5$\mu$. Turning now to FIG. 7 there is shown a schematic illustration of the build-up of an optically bistable device. This device comprises a gallium arsenide substrate 60, which may be doped or undoped, and a series of alternating n-type and p-type Dirac-delta doped monoatomic layers 61 to 69 formed on the substrate with each said Dirac-delta doped monoatomic layer being separated from the next adjacent Dirac-delta doped monoatomic layer by a layer of pure undoped intrinsic semiconductor material 70. in this case GaAs.

The energy band diagram for this optically bistable device is shown in FIG. 7a and the properties of the device may be varied, amongst other things, by varying the separation between the $D^3$ layers, located in the example of FIG. 7 at z1, z2, z3, z4 etc., which controls the superlattice period length $z_p$ and affects the recombination lifetime as described earlier in the introduction to the specification.

We claim:

1. An epitaxial semiconductor device in the form of an optically bistable semiconductor device comprising in sequence, a first layer (60) of an n-type semiconducting substrate, which may be doped or undoped, a series of alternately n-type and p-type Dirac-delta doped monoatomic layers (61, 62, 63, 64, 65, 66, 67, 68, 69) formed on said substrate with each said Dirac-delta doped monoatomic layer (61 to 69) being separated from the next adjacent Dirac-delta doped monoatomic layer by a layer (70) of pure undoped intrinsic semiconductor material.

2. A semiconductor device in accordance with claim 1 wherein the doping concentration in the Dirac-delta doped monoatomic layer lies in the range from $10^{11}$ to $10^{14}$ cm$^{-2}$.

* * * * *